US012803536B2

(12) United States Patent
Choudhary et al.

(10) Patent No.: US 12,803,536 B2
(45) Date of Patent: Nov. 17, 2026

(54) METHOD AND SYSTEM FOR CONTROLLING CAPACITIVE LOAD FOR RING OSCILLATOR

(71) Applicant: Samsung Electronics Co., Ltd., Suwon-si (KR)

(72) Inventors: Mohit Singh Choudhary, Bangaluru (IN); Praveen Rathee, Bangaluru (IN); Mohd Aquif, Bangaluru (IN); Vishnu Kalyanamahadevi Gopalan Jawarlal, Bangaluru (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 19/169,551

(22) Filed: Apr. 3, 2025

(65) Prior Publication Data

US 2026/0106600 A1 Apr. 16, 2026

(30) Foreign Application Priority Data

Oct. 16, 2024 (IN) ............................ 202441078581
Feb. 17, 2025 (IN) ............................ 202441078581

(51) Int. Cl.
*H03K 3/011* (2006.01)
*H03K 3/03* (2006.01)
(Continued)

(52) U.S. Cl.
CPC ........... *H03K 3/011* (2013.01); *H03K 3/0315* (2013.01); *H03L 7/097* (2013.01); *H03L 7/0995* (2013.01)

(58) Field of Classification Search
CPC .... H03K 3/011; H03K 3/0315; H03L 7/0995; H03L 7/097
(Continued)

(56) References Cited

U.S. PATENT DOCUMENTS 9,240,792 B2 1/2016 McCorquodale et al.
9,391,626 B2 * 7/2016 Chern .................. H03L 7/0995
(Continued)

FOREIGN PATENT DOCUMENTS

CN 114785340 A 7/2022
CN 115102548 A 9/2022
(Continued)

OTHER PUBLICATIONS

Zhang, X., et al., "A Low-Power, Process-and- Temperature-Compensated Ring Oscillator With Addition-Based Current Source," IEEE Transactions on Circuits and Systems, Regular Papers, vol. 58, No. 5, May 2011.
Wang, S., "Low-Voltage, Full-Swing Voltage-Controlled Oscillator With Symmetrical Even-Phase Outputs Based on Single-Ended Delay Cells," IEEE Transactions on Very Large Scale Integration (VLSI) Systems, vol. 23, Issue 9, Sep. 2015.
(Continued)

*Primary Examiner* — Arnold M Kinkead
(74) *Attorney, Agent, or Firm* — Fish & Richardson P.C.

(57) ABSTRACT

A method for controlling a capacitive load for a ring oscillator may include determining, using a comparator bank, at least one Process Voltage and Temperature (PVT) condition of the ring oscillator based on a ring top voltage, the comparator bank including a first comparator and a second comparator, and the ring oscillator including a plurality of stages, and controlling, using processing circuitry, a capacitive load of the ring oscillator based on the determined at least one PVT condition, the capacitive load connected at an output of each stage of the plurality of stages of the ring oscillator.

17 Claims, 19 Drawing Sheets

(51) Int. Cl.
*H03L 7/097* (2006.01)
*H03L 7/099* (2006.01)

(58) Field of Classification Search
USPC .................................. 331/57, 183, 175, 176
See application file for complete search history.

(56) References Cited

U.S. PATENT DOCUMENTS

| | | | |
|---|---|---|---|
| 9,685,931 B2 | 6/2017 | Taghivand et al. | |
| 10,447,253 B2 | 10/2019 | Khare | |
| 11,689,206 B1 | 6/2023 | Moehlmann et al. | |
| 2016/0191026 A1* | 6/2016 | Li .......................... | H03L 7/0995 331/57 |
| 2023/0387923 A1 | 11/2023 | Tsai et al. | |

FOREIGN PATENT DOCUMENTS

| | | |
|---|---|---|
| CN | 106972857 B | 3/2023 |
| CN | 116505938 B | 9/2023 |
| WO | 2022-116400 A1 | 6/2022 |

OTHER PUBLICATIONS

Kanar, T., et al., "A 2-15 Ghz VCO With Harmonic Cancellation for Wide-Band Systems," IEEE Microwave and Wireless Components Letters, vol. 26, Issue 11, Nov. 2016.
Esmaeilzadeh, M., et al., "A Low-Phase-Noise CMOS Ring Voltage-Controlled Oscillator Intended for Time-Based Sensor Interfaces," IEEE Access, vol. 10, 2022.

* cited by examiner

METHOD AND SYSTEM FOR CONTROLLING CAPACITIVE LOAD FOR RING OSCILLATOR

CROSS-REFERENCE TO RELATED APPLICATION

This application claims the benefit of priority under 35 U.S.C. § 119 to Indian Provisional Patent Application No. 202441078581, filed on Oct. 16, 2024, and Indian Non-Provisional patent application No. 202441078581, filed on Feb. 17, 2025, in the Indian Intellectual Property Office, the disclosures of each which are incorporated by reference herein in their entirety.

BACKGROUND

Some example embodiments of the inventive concepts generally relate to the field of integrated circuits (ICs), and more particularly relate to a method, a device, and/or a system, etc., for controlling a capacitive load for a ring oscillator.

Oscillators are used in a variety of electronic circuits, such as analog circuits, digital circuits, mixed analog-digital circuits, and/or radio frequency circuits, etc. Within these circuits, oscillators are used as, or in conjunction with, Phase Locked Loops (PLL), clock generators, frequency generators, frequency multipliers, frequency dividers, and/or mixers, etc., among other circuit components. One type of oscillator is a ring oscillator (also referred to as a ring) which connects an odd number of inverting gain stages in a ring arrangement.

With the advancement in nanometer (nm) scale technology in ICs, power supply voltage may be scaled down to around 0.8V which has limited the headroom available for stacked circuits in ICs. With limited power supply in current controlled oscillator (CCO), it becomes difficult to design an ultra-high speed ring oscillator for wide frequency ranges across process voltage temperature (PVT) as well as CCOs which meet the phase noise (PN) and/or power supply induced jitter (PSIJ) stringent specifications. Conventionally, the ring oscillator which meets the specification in slow-slow (SS) corner use cases are too fast to meet frequency requirement in fast-fast (FF) corner use cases.

There are five possible corner use cases: typical-typical (TT), fast-fast (FF), slow-slow (SS), fast-slow (FS), and slow-fast (SF). The 'fast' corner typically combines fast transistors and low parasitic resistances, the 'slow' corner combines slow transistors and large parasitic resistances, etc.

To elaborate, at a SS corner, because the field effect transistors (FETs) are slow, the ring top voltage is too high which limits the drain to source voltage ($V_{DS}$) of the current source. The limited $V_{DS}$ pushes the current source in a linear region making it susceptible to supply noise and increases the PSIJ at the output. This constraint requires that the ring to be extremely fast which further complicates the design of ultra high-speed ring with wide band frequency. At a FF corner, the ring top voltage is too low which degrades the signal to noise ratio (SNR) and limits PN specification at the output. Thus, a higher PN increases the jitter at the output and this constraint requires and/or desires a slower ring to improve the SNR at the output of ring.

Therefore, there is a desire and/or a need for a method, a device, and/or system that overcomes some or all the shortcomings and/or limitations of the above-discussed conventional techniques.

SUMMARY

This summary is provided to introduce a selection of concepts, in a simplified format, that are further described in the detailed description. This summary is neither intended to identify key or essential inventive concepts of the inventive concepts nor is it intended for determining the scope of the inventive concepts.

According to at least one example embodiment of the inventive concepts a method for operating a ring oscillator may comprise determining, using a comparator bank, at least one Process Voltage and Temperature (PVT) condition of the ring oscillator based on a ring top voltage, the comparator bank including a first comparator and a second comparator, and the ring oscillator including a plurality of stages, and controlling, using processing circuitry, a capacitive load of the ring oscillator based on the determined at least one PVT condition, the capacitive load connected at an output of each stage of the plurality of stages of the ring oscillator.

According to at least one example embodiment of the inventive concepts, a system for controlling a ring oscillator may comprise a ring oscillator included in a Phase Locked Loop (PLL), the ring oscillator including a plurality of stages, a comparator bank configured to determine at least one Process Voltage and Temperature (PVT) condition based on a ring top voltage in the ring oscillator, the comparator bank including a first comparator and a second comparator, and processing circuitry connected to the ring oscillator, the processing circuitry configured to control a capacitive load connected at an output of each stage of the plurality of stages of the ring oscillator based on an output of the comparator bank.

According to at least one example embodiment of the inventive concepts, a device may include a ring oscillator including a plurality of stages, a comparator bank configured to determine at least one Process Voltage and Temperature (PVT) condition based on a ring top voltage in the ring oscillator, the comparator bank including a first comparator and a second comparator, and processing circuitry connected to the ring oscillator, the processing circuitry configured to control a capacitive load connected at an output of each stage of the plurality of stages of the ring oscillator based on an output of the comparator bank.

To further clarify the advantages and features of one or more example embodiment of the inventive concepts, a more particular description of some example embodiments will be rendered by reference to specific example embodiments thereof, which is illustrated in the appended drawings. It will be appreciated that these drawings depict only typical example embodiments of the inventive concepts and are therefore not to be considered limiting the scope of the inventive concepts. Some example embodiments will be described and explained with additional specificity and detail with the accompanying drawings.

BRIEF DESCRIPTION OF THE DRAWINGS

These and other features, aspects, and advantages of one or more example embodiments of the inventive concepts will become better understood when the following detailed description is read with reference to the accompanying drawings in which like characters represent like parts throughout the drawings, wherein.

Figure 1A:
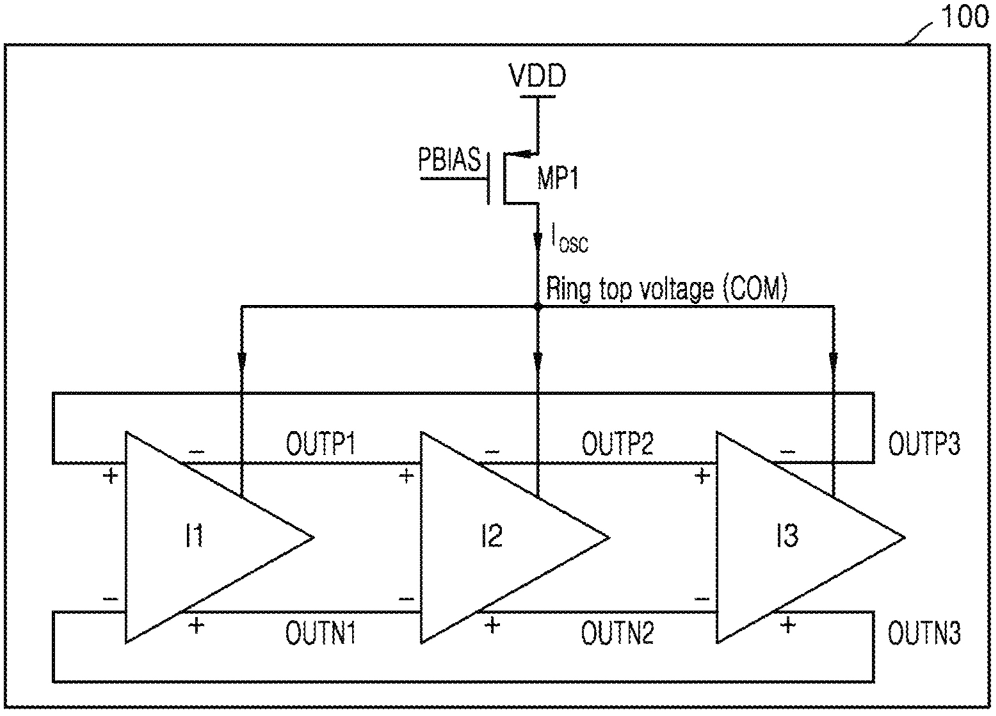
FIG. 1A illustrates a CCO, in accordance with the related art.

Further, a person of ordinary skill in the art will appreciate that elements in the drawings are illustrated for simplicity and may not have necessarily been drawn to scale. For example, the flow charts illustrate the method operations in terms of representative operations involved to help to improve understanding of aspects of the inventive concepts. Furthermore, in terms of the construction of the device, one or more components of the device may have been represented in the drawings by conventional symbols, and the drawings may show only those specific details that are pertinent to understanding the example embodiments of the inventive concepts so as not to obscure the drawings with details that will be readily apparent to those of ordinary skill in the art having the benefit of the description herein.

DETAILED DESCRIPTION

For the purpose of promoting an understanding of the inventive concepts, reference will now be made to the some example embodiments and specific language will be used to describe the same. It will nevertheless be understood that no limitation to the scope of the inventive concepts is thereby intended, and alterations and/or further modifications may be made to the illustrated example embodiments, and such further applications of the inventive concepts as illustrated therein are contemplated as would normally occur to one of ordinary skill in the art to which the inventive concepts relate.

The term "some" or "one or more" as used herein is defined as "one", "more than one", or "all." Accordingly, the terms "more than one," "one or more" or "all" would all fall under the definition of "some" or "one or more". The term "an example embodiment", "another example embodiment", "some example embodiments", or "one or more example embodiments" may refer to one example embodiment or several example embodiments, or all example embodiments. Accordingly, the term "some example embodiments" is defined as meaning "one example embodiment, or more than one example embodiment, or all example embodiments."

The terminology and structure employed herein are for describing, teaching, and illuminating some example embodiments and their specific features and/or elements and do not limit, restrict, or reduce the spirit and scope of the claims or their equivalents.

More specifically, any terms used herein such as but not limited to "includes," "comprises," "has," "consists," "have" and grammatical variants thereof do not specify an exact limitation and/or restriction and certainly do not exclude the possible addition of one or more features and/or elements, unless otherwise stated, and must not be taken to exclude the possible removal of one or more of the listed features and elements, unless otherwise stated with the limiting language "must comprise" or "needs to include".

Whether or not a certain feature and/or element was limited to being used only once, either way, it may still be referred to as "one or more features", "one or more elements", "at least one feature", and/or "at least one element." Furthermore, the use of the terms "one or more" or "at least one" feature or element does not preclude there being none of that feature or element unless otherwise specified by limiting language such as "there needs to be one or more" or "one or more element is required."

Unless otherwise defined, all terms, and especially any technical and/or scientific terms, used herein may be taken to have the same meaning as commonly understood by one of ordinary skill in the art.

Some example embodiments of the inventive concepts will be described below in detail with reference to the accompanying drawings.

An example diagram depicting a scenario with a CCO 100 is shown in FIG. 1A, in accordance with the related art. In particular, FIG. 1A depicts an example scenario where invertors I1, I2 and I3 form a three-stage ring oscillator 100, and a positive channel filed effect transistor (PFET) MP1 provides current to the ring oscillator. Further, the ring top voltage (e.g., COM node voltage) is the function of frequency and corner. At a SS corner, COM voltage rises, thereby making the current source MP1 starved of the desired and/or required $V_{DS}$ (e.g., the current source MP1 does not receive the full amount of $V_{DS}$) due to a limited supply voltage ($V_{DD}$). The reduced $V_{DS}$ of MP1 pushes it out of saturation, thereby making it sensitive to supply noise and thus, PSIJ increases at the SS corner. At a FF corner, the COM voltage is low enough to reduce the SNR, but this degrades the output PN. Therefore, in sub 3 nm technology with a limited supply voltage ($V_{DD}$), it is more difficult and/or impossible to meet a desired frequency range.

Further, COM voltage is a programmable threshold analog comparator set, where the lower threshold is based on, for example, a SNR limitation/low swing in the fastest corner at high temperature, and the upper threshold is based on a current source headroom which is a limitation in the slowest corner low voltage and low temperature.

Figure 1B:
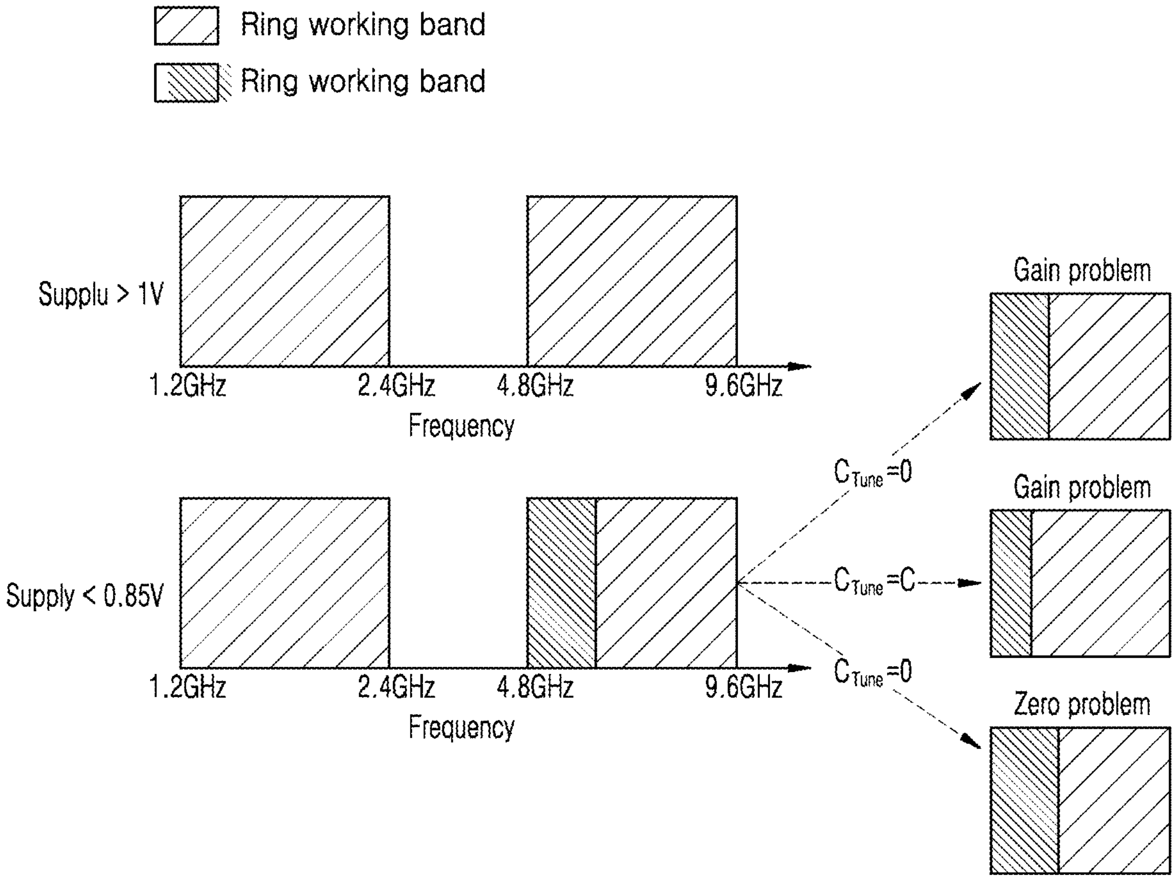
FIG. 1B illustrates an example graphical representation depicting performance of a CCO for supply voltage values less than 0.85V and above 1V over frequency range, in accordance with the related art.

Further, FIG. 1B illustrates an example graphical representation depicting performance of the CCO 100 with respect to supply voltage values ($V_{DD}$) less than 0.85V and above 1V over frequency range, along with errors encountered therein. The graph clearly shows the ring oscillator (e.g., the ring, etc.) working band and ring oscillator failure band for $V_{DD}$ less than 0.85V and above 1V over the frequency range of 1.2 GHz to 9.6 GHz. For $V_{DD}$ less than 0.85V, the CCO 100 is susceptible to a gain problem and/or a zero problem specifically over the desired frequency range of 4.8 GHz to 9.6 GHz.

Figure 1C:
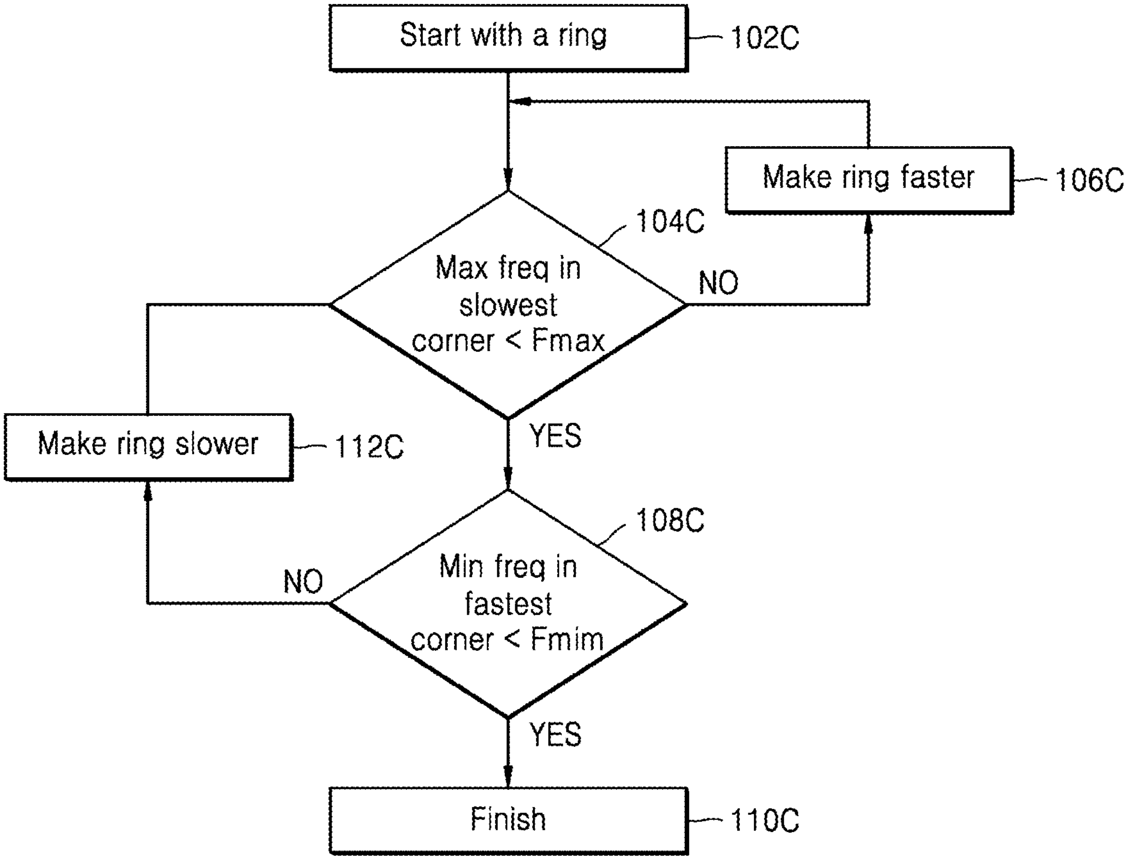
FIG. 1C illustrates an operational flow of a CCO, in accordance with the related art.

FIG. 1C illustrates an operational flow of a CCO 100 for a range 1:2 ($F_{min}$:$F_{max}$). At operation 102C, the CCO 100 starts with a ring oscillator. At operation 104C, if the maximum frequency in the slowest corner for the ring oscillator is greater than $F_{max}$, then the operation moves to the next operation 108C. If the maximum frequency in the slowest corner is not greater than $F_{max}$, then at operation 106C, the speed of the ring is increased.

At operation 108C, if the minimum frequency in the fastest corner for the ring oscillator is less than $F_{min}$, then operation ends at operation 110C. If the minimum frequency in the fastest corner for the ring oscillator is less than $F_{min}$, then the speed of the ring is reduced, and the operation is re-started from operation 104C onwards.

Further, the operation flow of CCO as disclosed in FIG. 1C with a low supply voltage (e.g., $V_{DD}$<0.9V) leads to a deadlock. Since the supply voltage is low, the ring top voltage (e.g., COM) having a maximum limit desires and/or requires the ring to be faster than a certain and/or desired threshold. However, a ring oscillator faster than the threshold is unable to meet the lower frequency margin in the fastest corners. Specifically, the faster ring does not meet the lower frequency margin in the fastest corner (FF) because it suffers from low gain in fast corners (FF), thereby desiring and/or requiring higher current to meet a DC gain which is desired and/or required for oscillations. Thus, this operation runs into a deadlock for low supply voltages, high frequency, and/or wide band range CCO, etc.

Figure 1D:
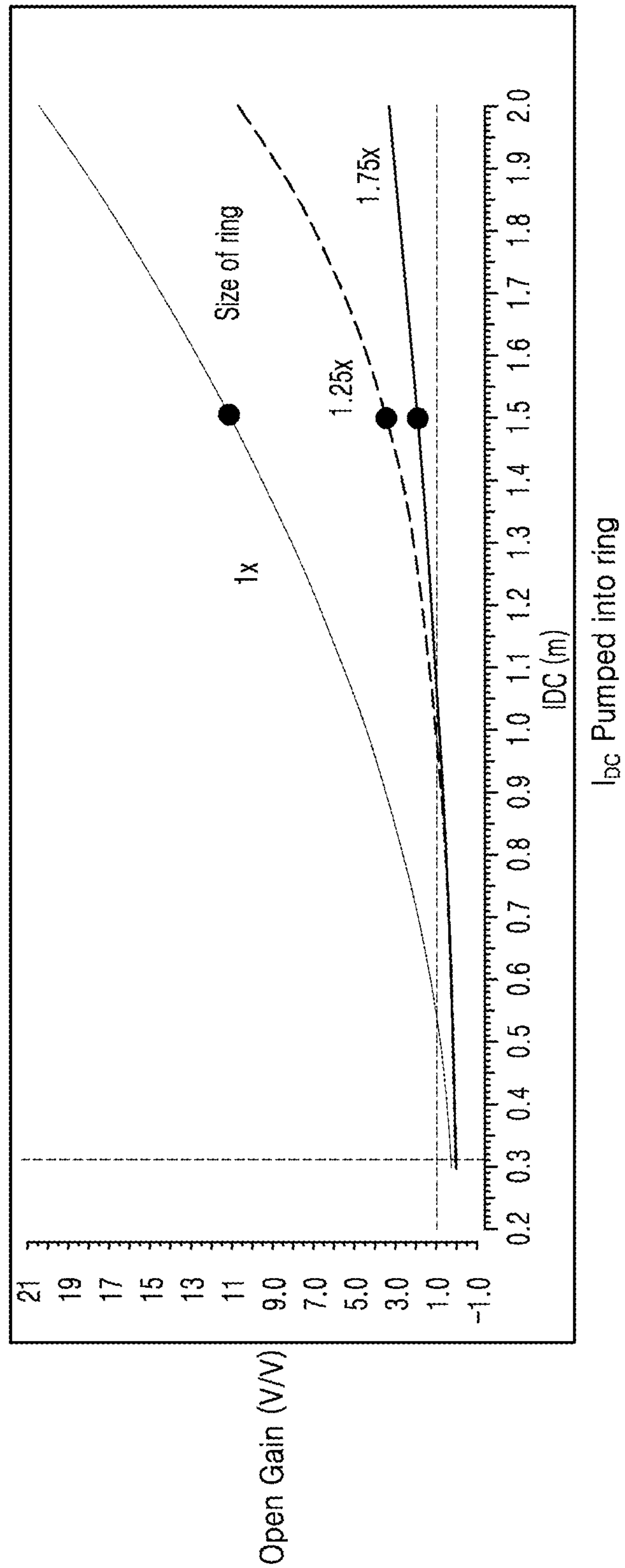
FIG. 1D illustrates gain degradation in a CCO, in accordance with the related art.
Figure 1E:
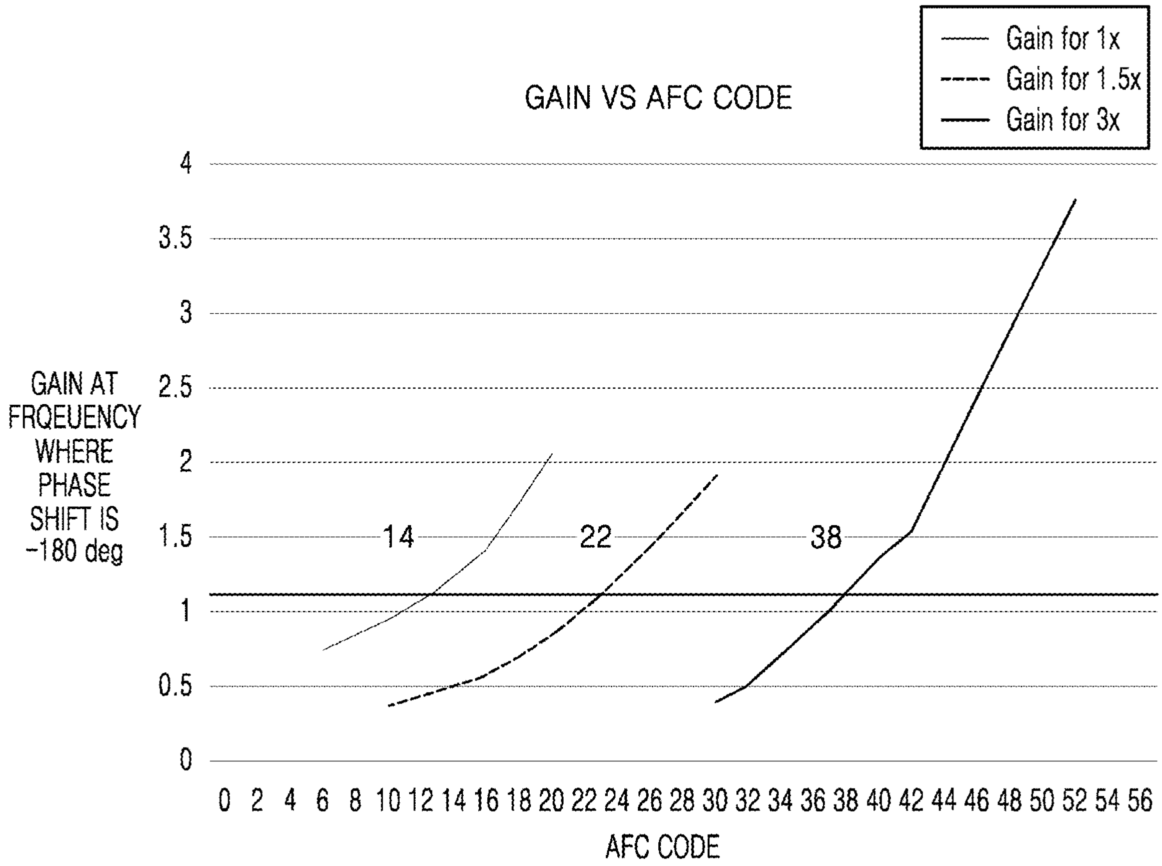
FIG. 1E illustrates gain oscillations in a CCO for faster ring, in accordance with the related art.

Further, for the CCO, the frequency tuning range is typically 1:2. As the size of ring is increased to meet a higher frequency (e.g., until a self-loading operation starts limiting the performance, etc.), the ring starts to suffer from gain degradation as shown in FIG. 1D. For a given current ring current IDC=1.5 mA, 1× ring has higher gain when compared to 1.75× ring. Therefore, more current is required for a faster ring to meet the gain for oscillation in the CCO as shown in FIG. 1E and table 1.

TABLE 1

| Ring size | Gain required for oscillations | Automatic frequency calibration (AFC) CODE | Current |
|---|---|---|---|
| 1× | >1 | 14 | 1× |
| 1.5× | >1 | 22 | 1.5× |
| 3× | >1 | 38 | 3× |

Figure 1F:
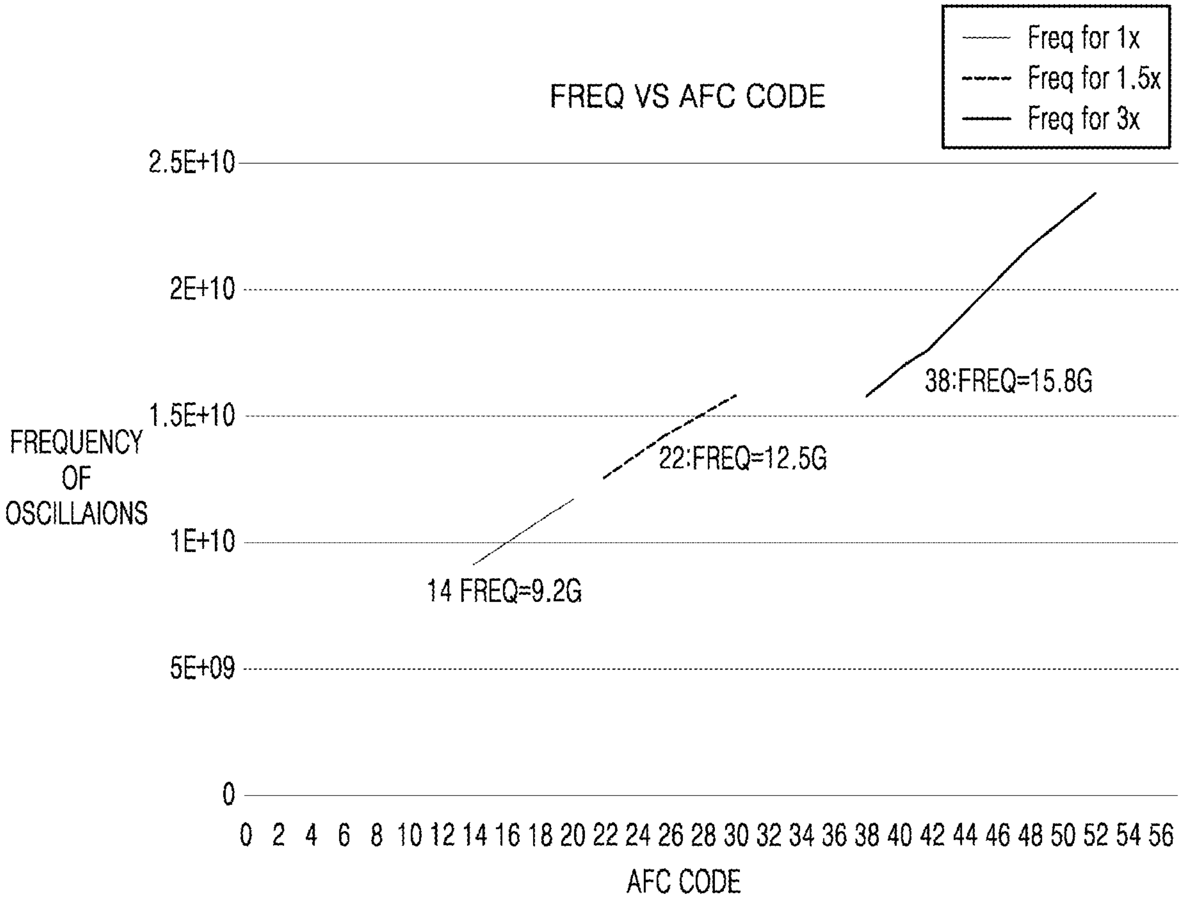
FIG. 1F illustrates gain degradation in fastest corner when ring size is fixed, in accordance with the related art.

When the ring size is fixed based on a slow corner, in the fastest corner, the starting frequency goes up due to gain degradation as shown in FIG. 1F and table 2.

TABLE 2

| Ring size | Starting Frequency | AFC CODE | Current |
|---|---|---|---|
| 1× | 9.2 G | 14 | 1× |
| 1.5× | 12.5 G | 22 | 1.5× |
| 3× | 15.8 G | 38 | 3× |

Thus, as the starting frequency of the ring goes up, it is more difficult and/or not possible to meet wide band requirements across process corners.

Figure 1G:
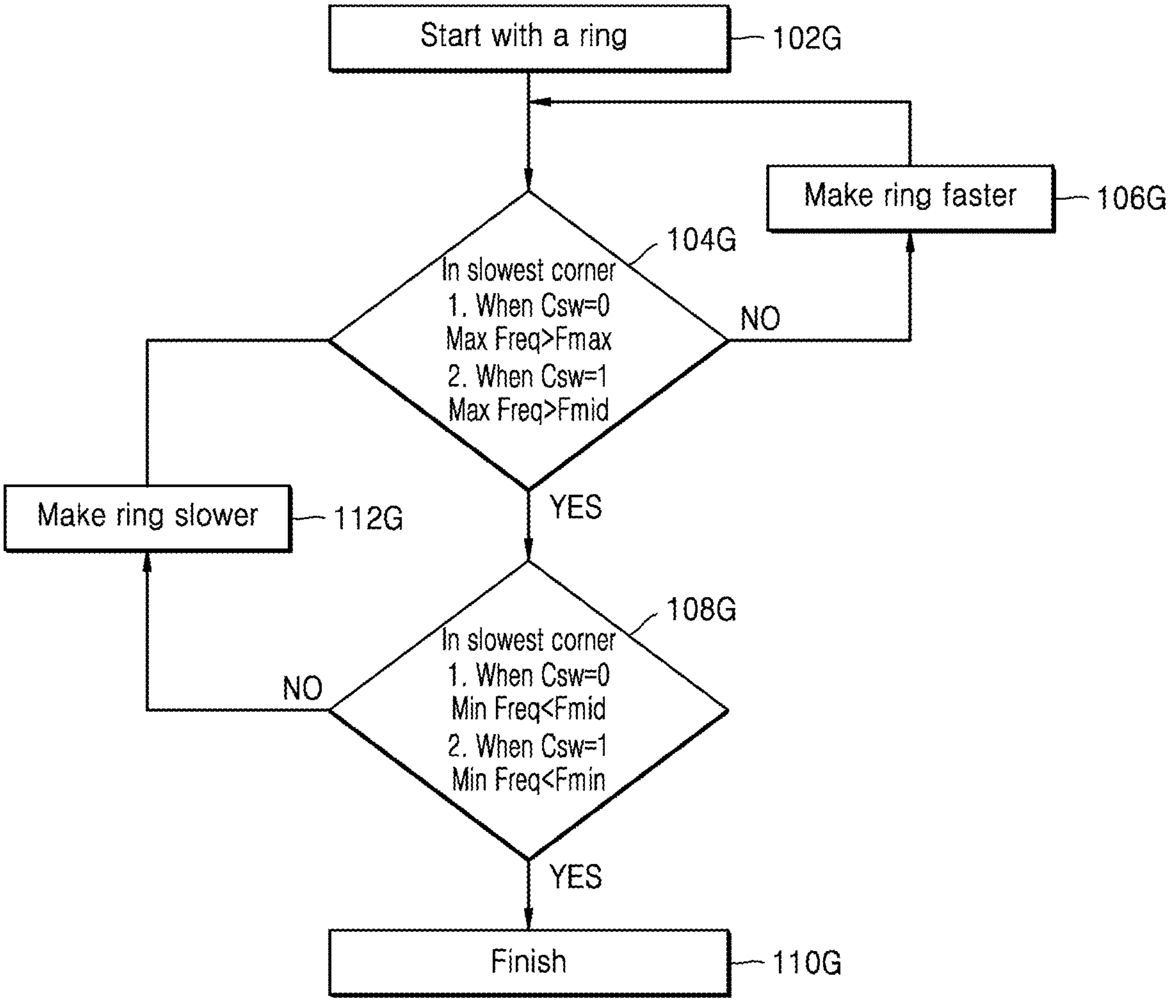
FIG. 1G illustrates an operation flow of a CCO in a deadlock condition, in accordance with the related art.
Figure 1H:
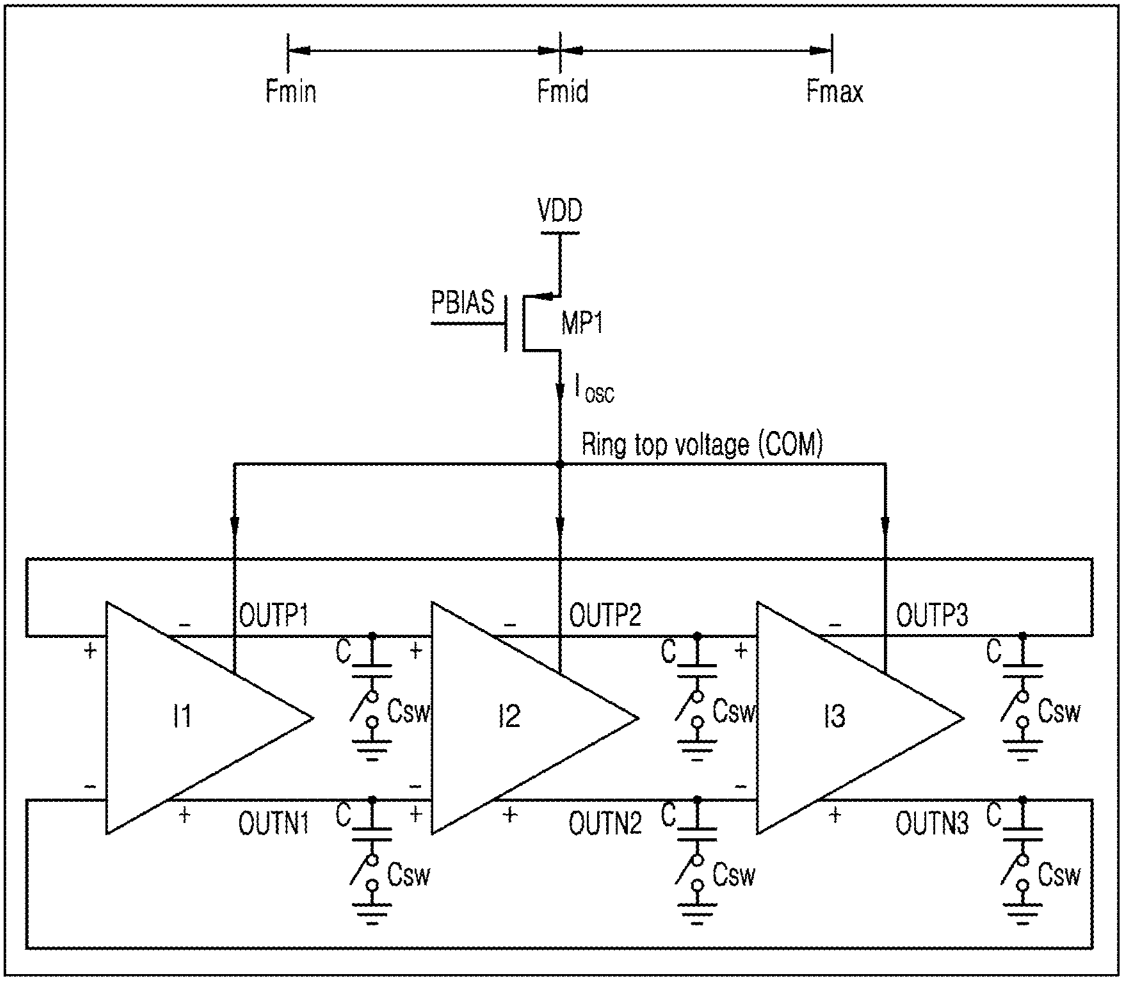
FIG. 1H illustrates circuit diagram of 3-stage ring oscillator with a switch controlled capacitive load, in accordance with the related art.

To break the deadlock condition as depicted in FIG. 1G, a fixed cap (e.g., a fixed capacitor, etc.) with a switch is added to define two frequency bands as shown in operational flow diagram of FIG. 1G and the circuit diagram of 3-stage ring oscillator with a switch controlled capacitive load shown in FIG. 1H. The cap switch defines two frequency bands, as: a) Cap Load added-Lower Band ($F_{min}$:$F_{mid}$); and b) No Cap load-Higher Band ($F_{mid}$:$F_{max}$).

At operation 102G, CCO with the fixed cap switch starts with a ring. At operation 104G, in the slowest corner of the ring, when the value of switch ($C_{sw}$) is 0, it is checked to determine if the maximum frequency is greater than $F_{max}$. If yes, then the operation moves to the next operation 108G. If the maximum frequency in the slowest corner is not greater than $F_{max}$, then at operation 106G, the speed of the ring is increased. When the value of switch ($C_{sw}$) is 1, it is checked to determine if the maximum frequency is greater than $F_{mid}$. If yes, then the operation moves to the next operation 108G. If the maximum frequency in the slowest corner is not greater than $F_{mid}$, then at operation 106G, the speed of the ring is increased.

At operation 108G, in the fastest corner, when the value of the switch ($C_{sw}$) is 0, it is checked to determine if the minimum frequency is less than $F_{mid}$. If yes, then the operation ends at operation 110G. If the minimum frequency is not less than $F_{mid}$, then at operation 112G, the value of C is increased, and the operation is re-started from operation 104G onwards. When the value of the switch ($C_{sw}$) is 1, it is checked to determine if the minimum frequency is less than $F_{min}$. If yes, then the operation ends at operation 110G. If the minimum frequency is not less than $F_{min}$, then at operation 112G, the value of C is increased, and the operation is re-started from operation 104G onwards.

Figure 1I:
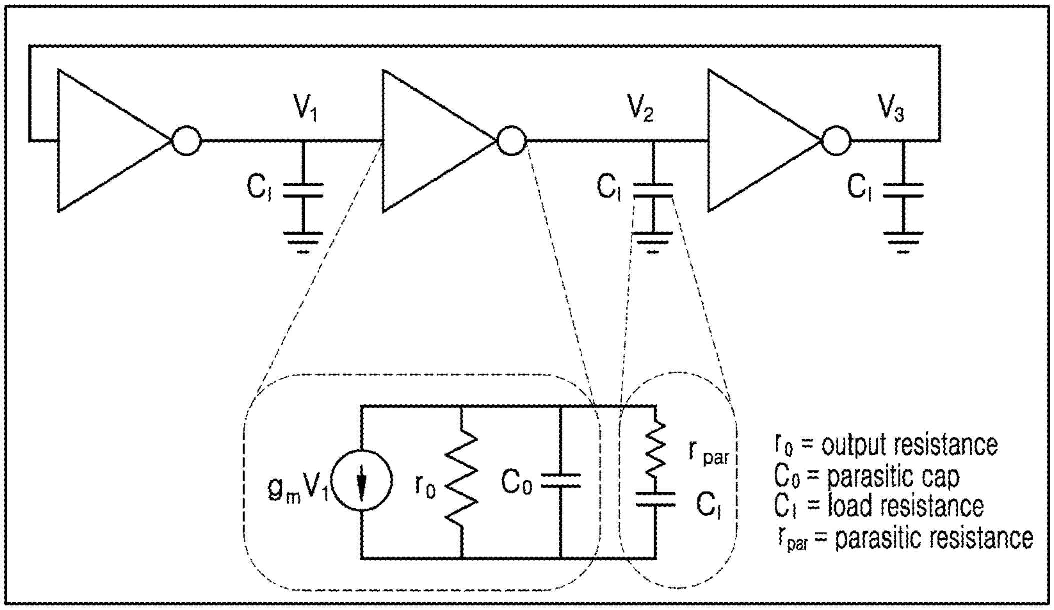
FIG. 1I illustrates circuit diagram of a CCO having single delay stage with capacitor load, in accordance with the related art.
Figure 1J:
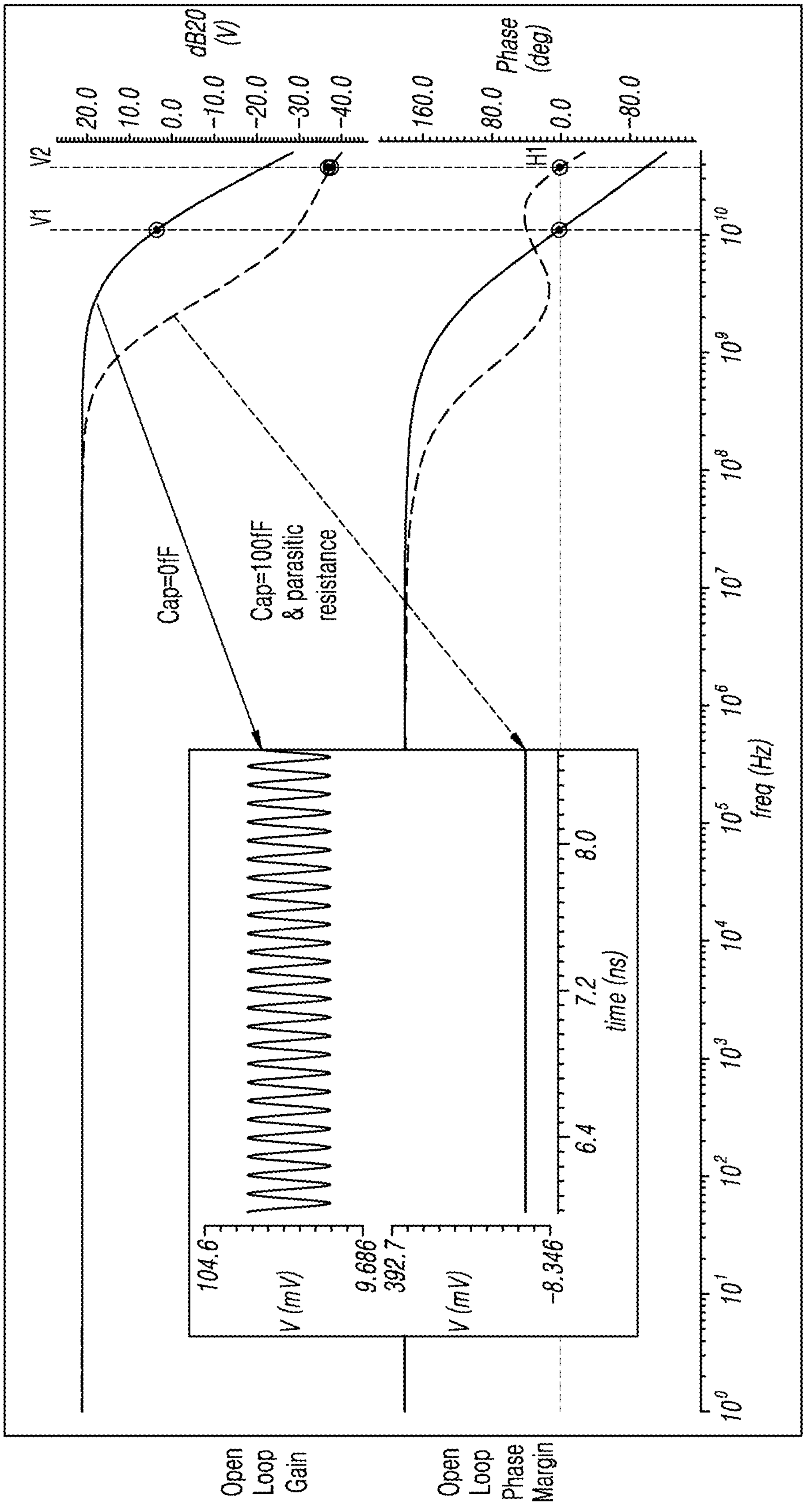
FIG. 1J illustrates comparison of Bode Plot for 3-stage ring oscillator with load cap=0 f and load cap=100 f, in accordance with the related art.
Figure 1K:
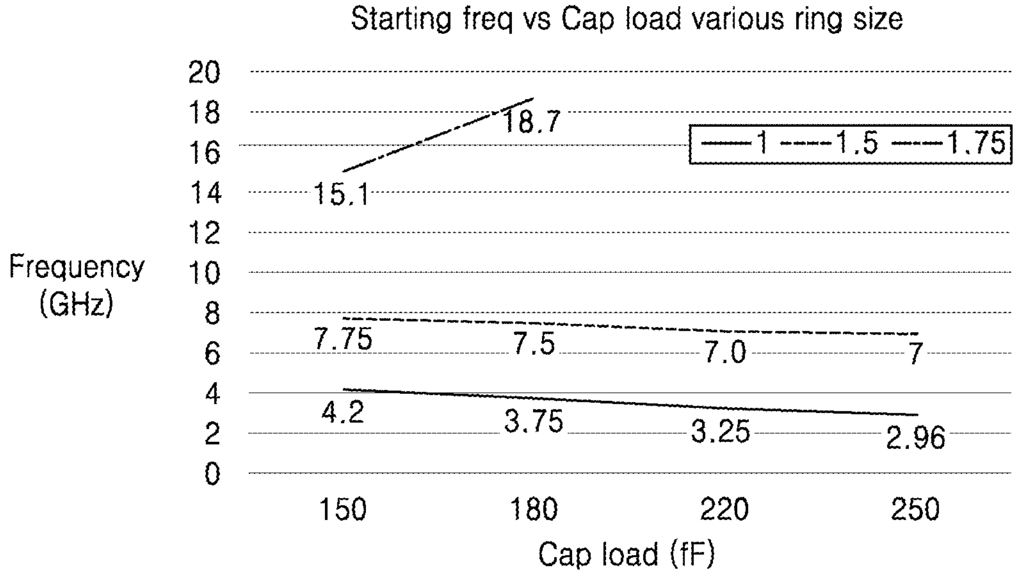
FIG. 1K illustrates example graphical representation of Starting frequency vs capacitor load for various ring sizes, in accordance with the related art.
Figure 1L:
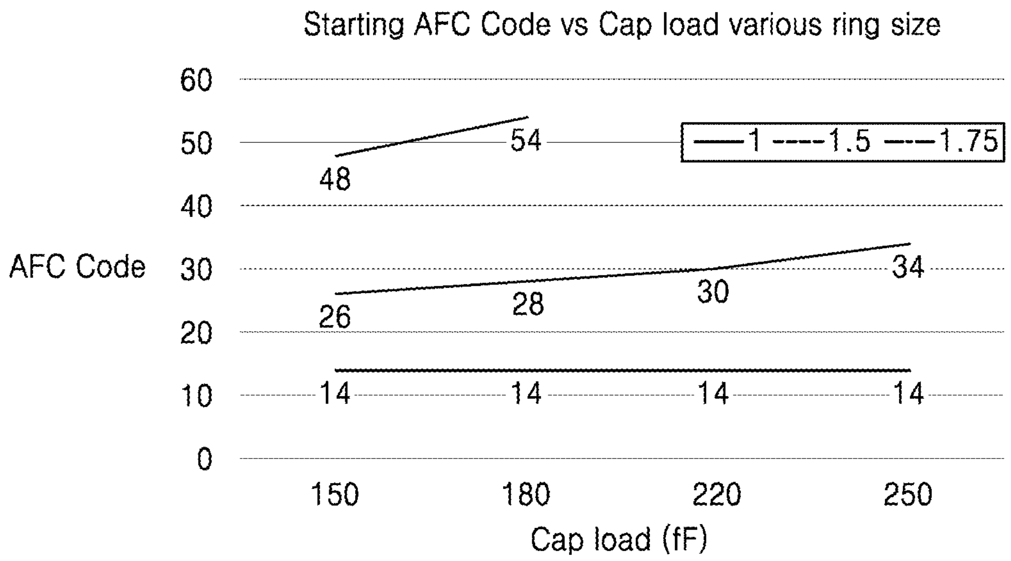
FIG. 1L illustrates example graphical representation of Automatic Frequency Calibration vs capacitor load for various ring sizes, in accordance with the related art.

Further, as shown in FIGS. 1I and 1J, any tuning cap $C_1$ added to the ring comes with a parasitic resistance forming a zero with $r_{par}$*$C_1$. As the ring is designed for higher frequency, the zero introduced due to $r_{par}$*$C_1$ comes into an operating bandwidth and hence cannot be ignored. The zero introduced changes the loop gain and phase of the oscillator in such a way that the phase requirement for oscillation shifts to a higher frequency where the gain is already degraded to less than 1, hence there are no oscillations. This is shown in FIGS. 1K and 1L where for a smaller ring increasing (e.g., the blue curve), the cap reduces the frequency. To specify, FIG. 1K illustrates an example graphical representation of a Starting frequency vs capacitor load for various ring sizes and FIG. 1L illustrates an example graphical representation of an Automatic Frequency Calibration vs capacitor load for various ring sizes. For a larger ring (e.g., the grey curve) increasing the cap does not decrease the frequency because of the parasitic zero. In summary, the parasitic zero problem becomes more prominent in a faster ring where the gain is already low.

Table 3 shown below presents a comparison between starting frequency and cap load for various ring sizes.

TABLE 3

| External Cap | Ring size = 1× | Ring size = 1.5× | Ring size = 3× |
|---|---|---|---|
| 150f | 4.2 G | 7.75 G | 15.1 G |
| 180f(20% Higher) | 3.75 G(11% lower) | 7.5 G(3% Lower) | 18.7 G(higher) |
| 220f(22% Higher) | 3.25 G(13% lower) | 7.1 G(5% Lower) | No oscillations |
| 250f(14% Higher) | 2.96 G(9.5% lower) | 7.0 G(1.5% Lower) | No oscillations |

Table 4 shown below presents a comparison between starting AFC Code and cap load for various ring sizes.

TABLE 4

| External Cap | Ring size = 1× | Ring size = 1.5× | Ring size = 3× |
|---|---|---|---|
| 150f | 14 | 26 | 48 |
| 180f(20% Higher) | 14 | 28 | 54 |
| 220f(22% Higher) | 14 | 30 | No oscillations |
| 250f(14% Higher) | 14 | 34 | No oscillations |

In addition, the parasitic zero problem binds the operation as disclosed in FIG. 1G in a deadlock (e.g., deadlock condition, etc.). To elaborate, there is a deadlock in deciding the ring size based on a process corner. To meet a frequency condition and/or requirement in a slowest corner, a faster/larger ring is desired and/or required. However, a larger ring suffers from gain deration and/or parasitic zero, etc., and in a fastest corner, the larger ring does not meet the desired and/or required frequency. On the other hand, if the ring size is fixed based on a fast corner, in the slowest corner, the ring does not meet the desired and/or required upper frequency range. Hence, there is a deadlock.

Figure 1M:
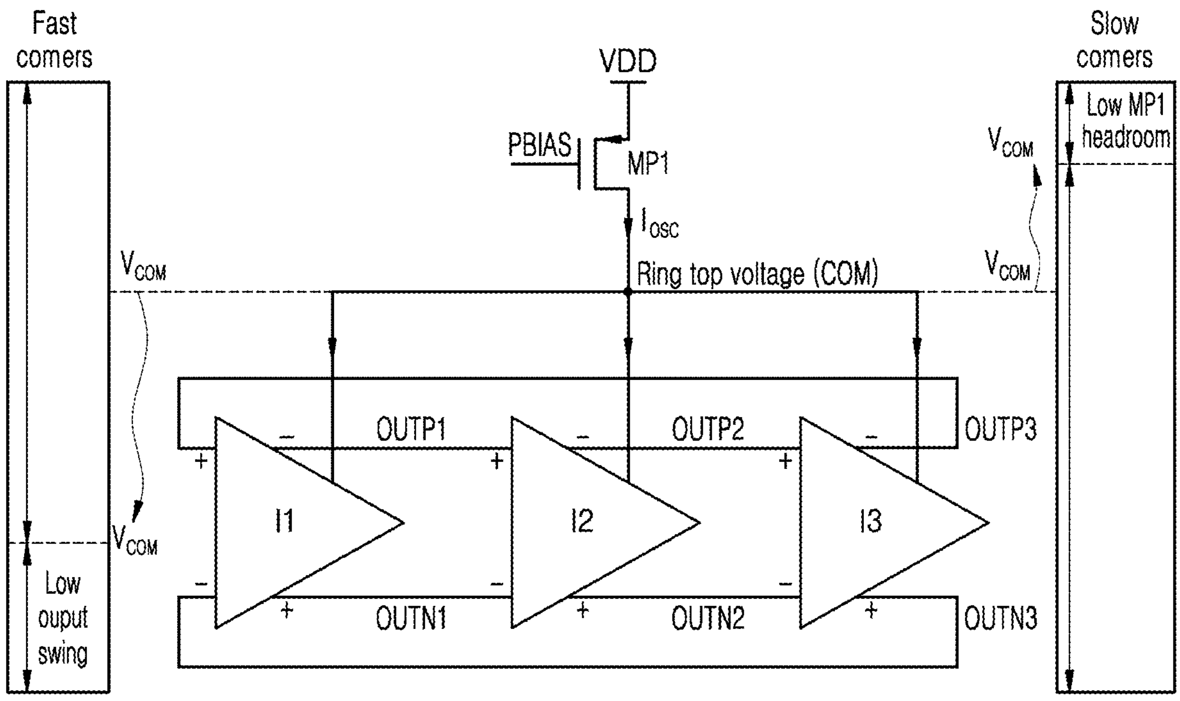
FIG. 1M illustrates circuit diagram of a CCO with inverters I1, I2 and I3 forming a three-stage ring oscillator, in accordance with the related art.

FIG. 1M shows a circuit diagram of a CCO with inverters I1, I2 and I3 forming a three-stage ring oscillator to delineate the problem of performance limitations in the CCO due to low supply voltage, high frequency, and/or wide band requirements, etc. Further, FIG. 1M also shows that higher Vcom is responsible for low headroom for MP1, which causes PSIJ to degrade. On the other hand, lower Vcom is responsible for bad SNR which degrades PN. As shown in FIG. 1M, the CCO comprises the PFET MP1 which provides current to the ring oscillator. At low VDD voltages (e.g., VDD<=0.9V), it is difficult to design a ring for max frequency >9 GHz and a 1:2 range. At a SS corner, COM voltage rises and makes the current source MP1 starve of the desired and/or required Vas (e.g., headroom) due to low VDD. The reduced $V_{ds}$ of MP1 pushes the ring out of saturation and makes it sensitive to supply noise. Thus, PSIJ (e.g., Power Supply Induced Jitter) increases in such cases. In fast corners, COM voltage is very low such that, the SNR degrades, and this degrades the output Phase Noise and/or jitter in turn.

Figure 2:
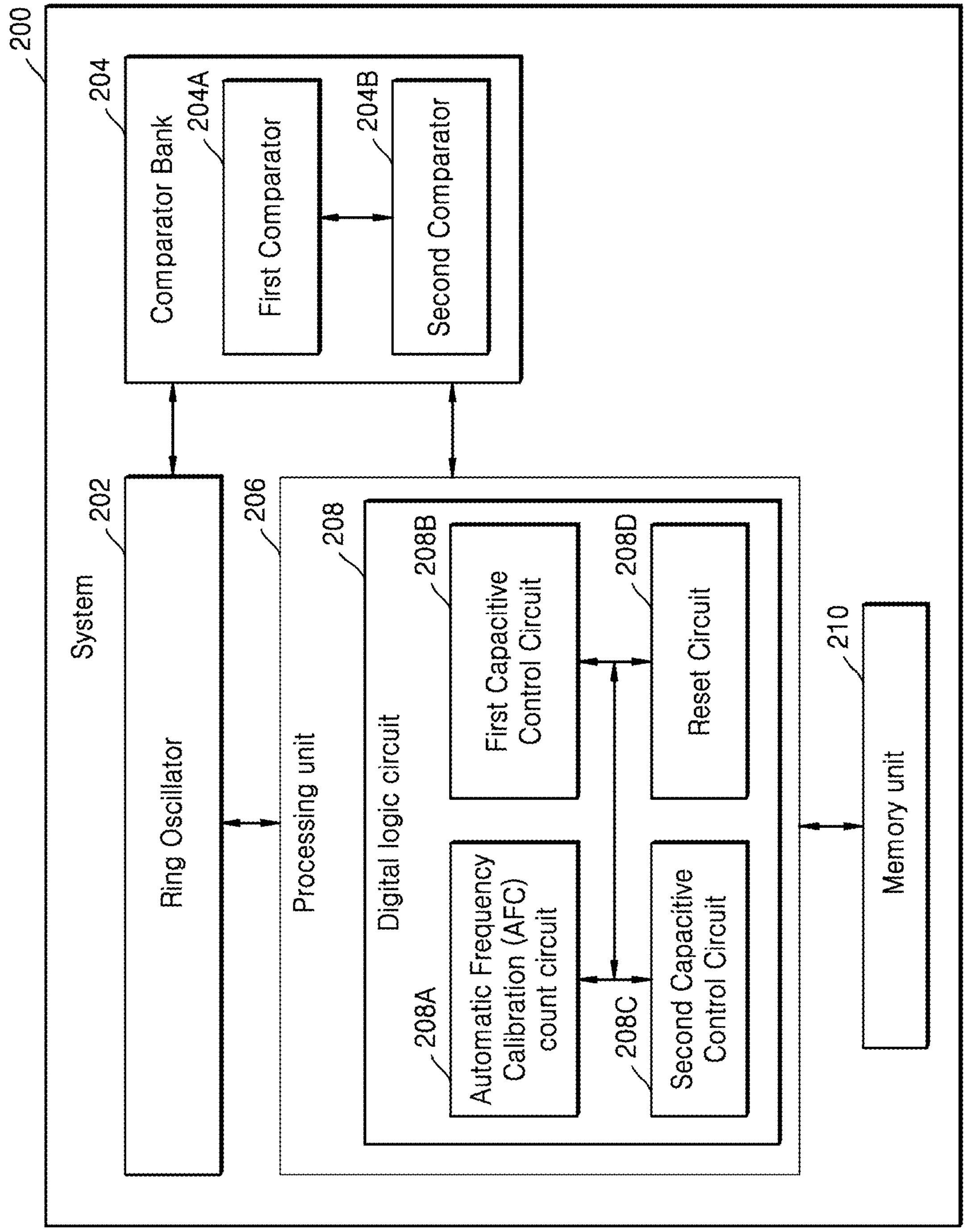
FIG. 2 illustrates a system for controlling a capacitive load for a ring oscillator, in accordance with at least one example embodiment of the inventive concepts.

FIG. 2 illustrates a system 200 for controlling a capacitive load for a ring oscillator, in accordance with at least one example embodiment of the inventive concepts. The system 200 comprises the ring oscillator 202 in a Phase Locked Loop (PLL). Further, the system 200 comprises a comparator bank 204 to determine Process Voltage and Temperature (PVT) conditions based on a ring top voltage in the ring oscillator 202, but is not limited thereto. The comparator bank 204 comprises a plurality of comparators, e.g., a first comparator 204A and a second comparator 204B, etc.

In some example embodiments, the system 200 further comprises a megacell, or a system-on-chip (SoC) which includes control logic (e.g., processing circuitry, etc.), such as a processing unit 206 (e.g., a Central Processing Unit, a Graphical Processing Unit, etc.), a Digital Logic Circuit 208, and/or a memory 210 (e.g., random access memory (RAM), a solid state drive (SSD), etc.), etc., but the example embodiments are not limited thereto.

The processing unit 206 may be, for example, a CISC-type (Complex Instruction Set Computer) CPU, RISC-type CPU (Reduced Instruction Set Computer), a digital signal processor (DSP), and/or a graphics processing unit (GPU), etc. The processing unit 206 may be a component in a variety of systems. For example, the processing unit 206 may be part of a standard personal computer, a server, a smart device, an Internet of Things device, and/or a workstation, etc. The processing unit 206 may be one or more general processors, digital signal processors, application-specific integrated circuits, field-programmable gate arrays, servers, networks, digital circuits, analog circuits, and/or any combinations thereof, or other now known or later developed devices for analyzing and processing data. The processing unit 206 may implement at least one software program, such as code generated manually (e.g., programmed, etc.).

The memory unit 210 (which may be memory such as RAM, flash memory, and/or disk storage, etc.) stores one or more software applications 612 (e.g., embedded applications, installed applications, streamed applications, etc.) that, when executed by the processing unit 206, perform any suitable function associated with the system 200. The memory unit 210 may include non-transitory computer-readable storage media, such as various types of volatile and non-volatile storage media, including but not limited to random access memory, read-only memory, programmable read-only memory, electrically programmable read-only memory, electrically erasable read-only memory, flash memory, magnetic tape or disk, optical media, and the like.

The digital logic circuit 208 (e.g., processing circuitry, etc.) is connected to the ring oscillator 202 (e.g., a ring, etc.). The digital logic circuit 208 is configured to control the capacitive load connected at the output of each stage of the plurality of stages of the ring oscillator 202 based on the output of the comparator bank 204, but is not limited thereto. The system 200 further comprises an Automatic Frequency Calibration (AFC) count circuit 208A included in the digital logic circuit 208, but the example embodiments are not limited thereto, and for example, the AFC count circuit 208A may be separate from the digital logic circuit 208, etc. Further, the AFC count circuit 208A is configured to detect a flag value associated with completion of an AFC cycle for the ring oscillator 202, but is not limited thereto.

The system 200 further comprises a first switch connected to a first set of capacitive load. The first switch is controlled by a first capacitive control circuit 208B of the digital logic circuit 208 and the first capacitive control circuit 208B is configured to control the first switch based on output from the comparator bank 204, but the example embodiments are not limited thereto.

The system 200 further comprises a second switch connected to a second set of capacitive load. Further, the second switch is controlled by a second capacitive control circuit 208C of the digital logic circuit 208 and the second capacitive control circuit 208C is configured to control the second switch based on output from the comparator bank 204, but the example embodiments are not limited thereto.

The system 200 further comprises a reset circuit 208D of the digital logic circuit 208, which is configured to restart the AFC cycle of the ring oscillator 202, but is not limited thereto. According to some example embodiments, one or more of the processing unit 206, the digital logic circuit 208, the AFC count circuit 208A, the first capacitive control circuit 208B, the second capacitive control circuit 208C, and/or the reset circuit 208D, etc., may be implemented as processing circuitry. The processing circuitry may include hardware or hardware circuit including logic circuits; a hardware/software combination such as a processor executing software and/or firmware; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc., but is not limited thereto.

Thus, PN is worse and/or is the worst in the corner where the output swing of oscillator is low which is generally the fastest corner. In at least one example embodiment of the inventive concepts, by adding an additional cap (e.g., capacitor) to the ring, the swing increases and thus the SNR improves.

Further, PSIJ is the worse and/or is the worst in the slow corner where the COM node voltage is high, which results in limited headroom for PMOS current source. In at least one example embodiment of the inventive concepts, the tuning cap (e.g., tuning capacitor, etc.) is removed in the PSIJ limiting corners to bring down the COM node voltage, thus providing larger headroom for current sources.

Thus, the system 200 enables dynamically making the ring fast or slow as desired by the user and/or as per the design requirement of the system by adding programmable capacitors at the output of ring oscillator. In a FF corner, a maximum cap (e.g., maximum capacitor, etc.) is added to improve and/or meet the frequency range and/or maintain ring top voltage, etc. In a SS corner, all caps are removed to improve and/or meet the frequency and/or ring top specifications, etc.

In the foregoing discussion, the term "connected" means at least either a direct electrical connection between the devices connected or an indirect connection through one or more passive intermediary devices. The term "circuit" means at least either a single component or a multiplicity of passive components, that are connected together to provide a desired function. Also, the terms "coupled to" or "couples with" (and the like) are intended to describe either an indirect or direct electrical connection. Thus, as an example, if an electronic device is coupled to another electronic device, that connection can be through a direct electrical connection, or through an indirect electrical connection via other devices and connections.

Figure 3:
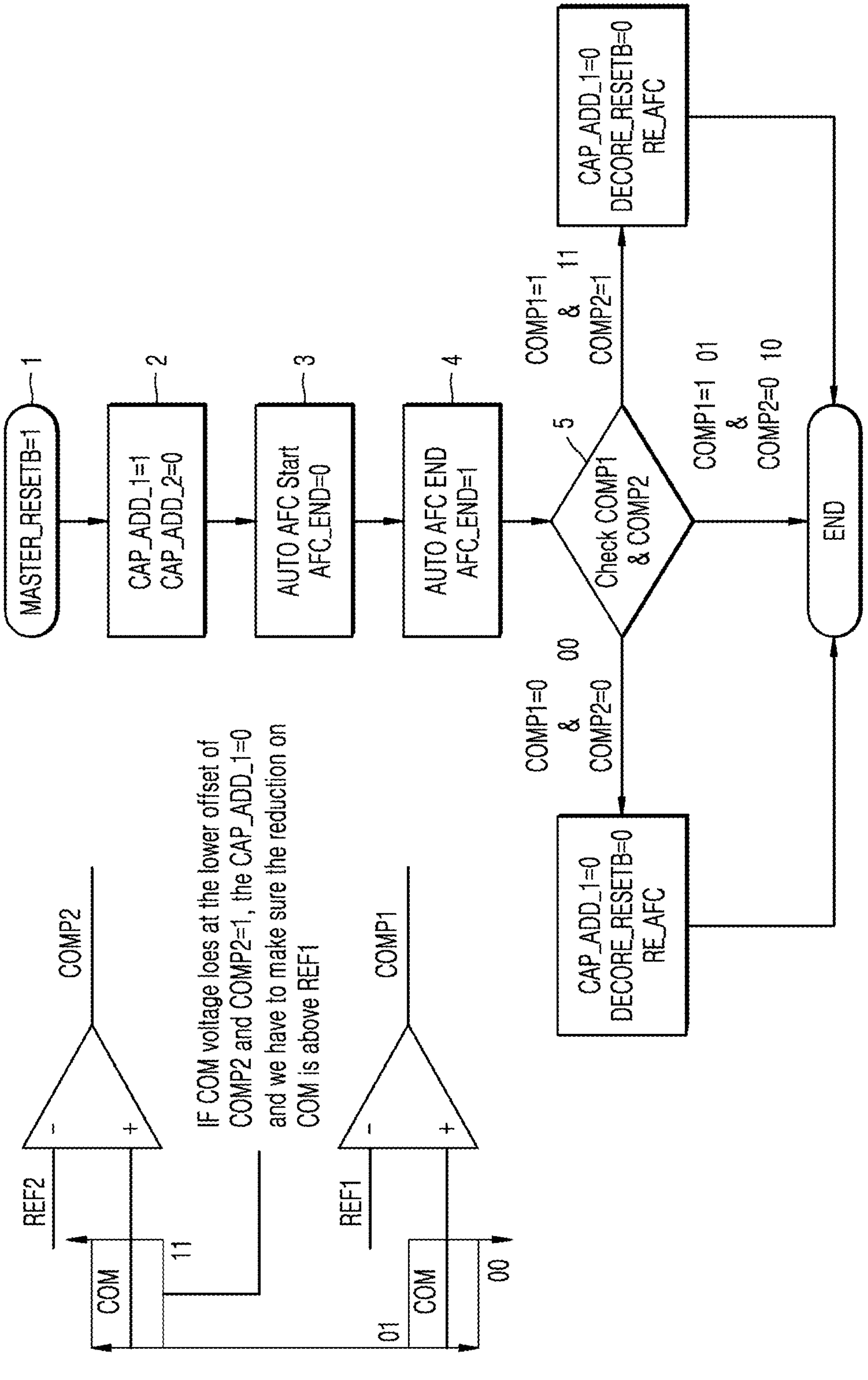
FIG. 3 illustrates an operational flow chart of the circuit, in accordance with at least one example embodiment of the inventive concepts.

FIG. 3 illustrates an operational flow chart of the circuit, in accordance with at least one example embodiment of the inventive concepts. At operation 1, when MASTER_RESETB is high/1, a fixed decision on the oscillator's capacitive loading is taken at operation 2. According to at least one example embodiment of the inventive concepts, the circuit provides the flexibility of loading the ring with: Cap 'C1', Cap 'C1'+'C2', and/or no external load, but the example embodiments are not limited thereto. By using a fixed decision, the ring is loaded with cap 'C1', after MASTER_RESETB is high/1, and before the start of first AFC, but is not limited thereto. MASTER_RESERB is the reset signal which resets the complete digital and analog parts of a Phase Locked Loop (PLL). C1 is a capacitor connected to switch CAP_ADD_C1 and C2 is a capacitor added to switch CAP_ADD_C2, etc. Thus, by turning on a respective switch, a corresponding capacitor is added.

At operation 3, the first AFC starts. The flag, if AFC is completed or not, is AFC_END. At this operation, AFC_END-0. The circuit triggers reAFC based on the comparators outputs, and in order to decrease and/or prevent the circuit from getting stuck in a reAFC loop, AFC_END and AFC_COUNT are used. Once the MASTER_RESETB turns on the PLL, the initial AFC is done, at the end of AFC, AFC_END goes HIGH which after one or more D type Flip Flops (DFFs) delay(s) causes AFC_COUNT=1. The comparators compare the COM node voltage and makes a decision to add or remove capacitors. Once the decision is done, the comparators reset the DCORE to start reAFC. Once the AFC_COUNT=1, reAFC is not triggered and decreases and/or prevents the circuit from being stuck in a loop.

At operation 4, when the first AFC is completed, the AFC_END goes high (e.g., AFC_END=1). This marks the end of a first frequency calibration.

At operation 5, after the first AFC is completed, the ring top voltage (COM) is compared with two fixed reference voltages (e.g., V1 and V2), but is not limited thereto.

If the COM voltage is greater than the reference voltage V2, the initial loading of C1 is removed by controlling the switch CAP_ADD_C1. If the COM voltage is lower than the reference voltage V1, the ring is loaded with C2 (e.g., the capacitance of C2 is added to the circuit, etc.) in addition to the initial load of C1. This additional load C2 is controlled by the switch CAP_ADD_C2. If the COM voltage is between V1 and V2, the loading of the ring is unchanged.

Since there is no fixed cap load, a comparatively slower ring may be used, while improving and/or ensuring that a higher frequency margin is met, and the ring top in slow corners, is within the limit set by low supply. Some example embodiments of the inventive concepts enable the freedom to choose a slower ring because a slower ring has better gain, which lowers the starting frequency in fast corners. Further, the desire and/or requirement of capacitance to meet a lower frequency margin in fast corners is also low. In addition, the zero problem is decreased and/or avoided firstly, by having better gain in slower ring, and secondly, by having a lower requirement of load capacitance, etc.

Figure 4:
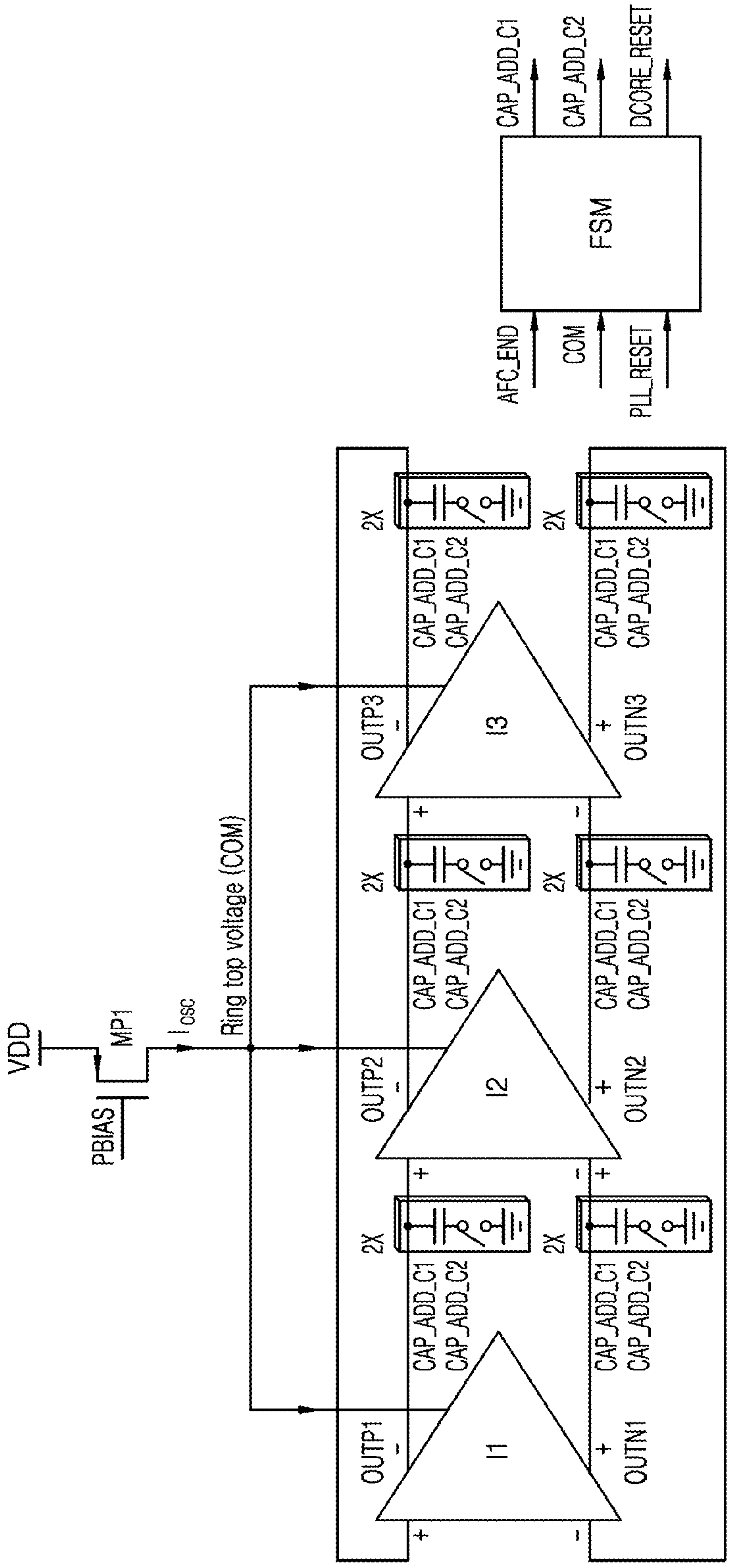
FIG. 4 illustrates a circuit diagram of the current controlled oscillator, in accordance with at least one example embodiment of the inventive concepts.

FIG. 4 illustrates a circuit diagram of the current controlled oscillator 202, in accordance with at least one example embodiment of the inventive concepts. FIG. 4 shows a digital circuit with a plurality of caps and switches integrated with the ring oscillator, but the example embodiments are not limited thereto. The circuit further comprises at least one programmable cap bank and/or a Finite State Machine (FSM), etc., but is not limited thereto. Initially, a capacitive load, 'C1' is given as an input. After a first AFC, a ring top voltage (COM) is compared with two fixed reference voltages and a decision is made to either increase the load, decrease the load, or keep it unchanged, as also explained in FIG. 3, but the example embodiments are not limited thereto. As shown in FIG. 4, the loads on the ring nodes are dynamically switched through switches and are controlled through signals 'CAP_ADD_C1' and 'CAP_ADD_C2' driven by the FSM, but are not limited thereto.

Figure 5A:
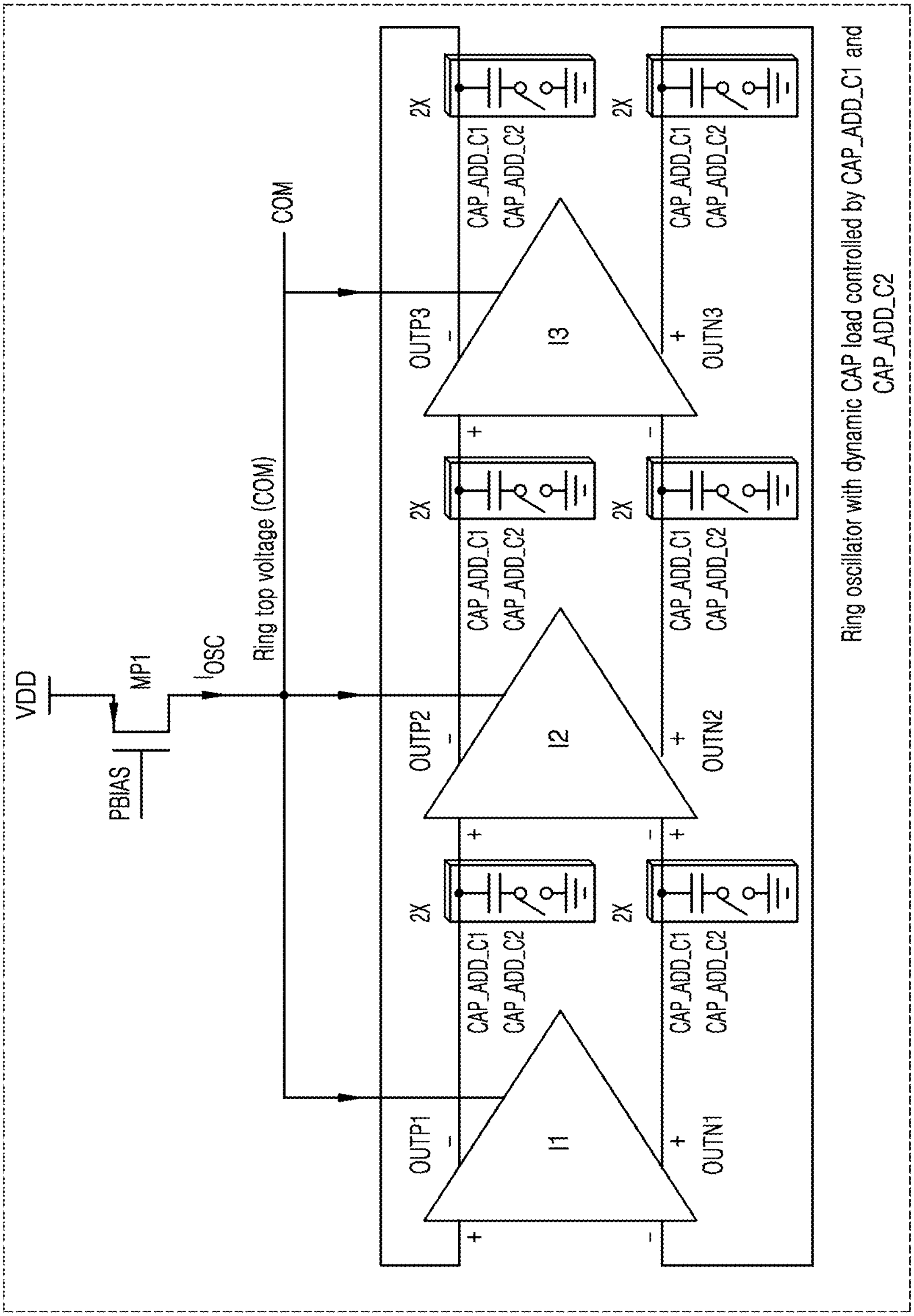
FIG. 5A and FIG. 5B illustrate schematic diagram of the circuit of the current controlled oscillator, in accordance with at least one example embodiment of the inventive concepts.
Figure 5B:
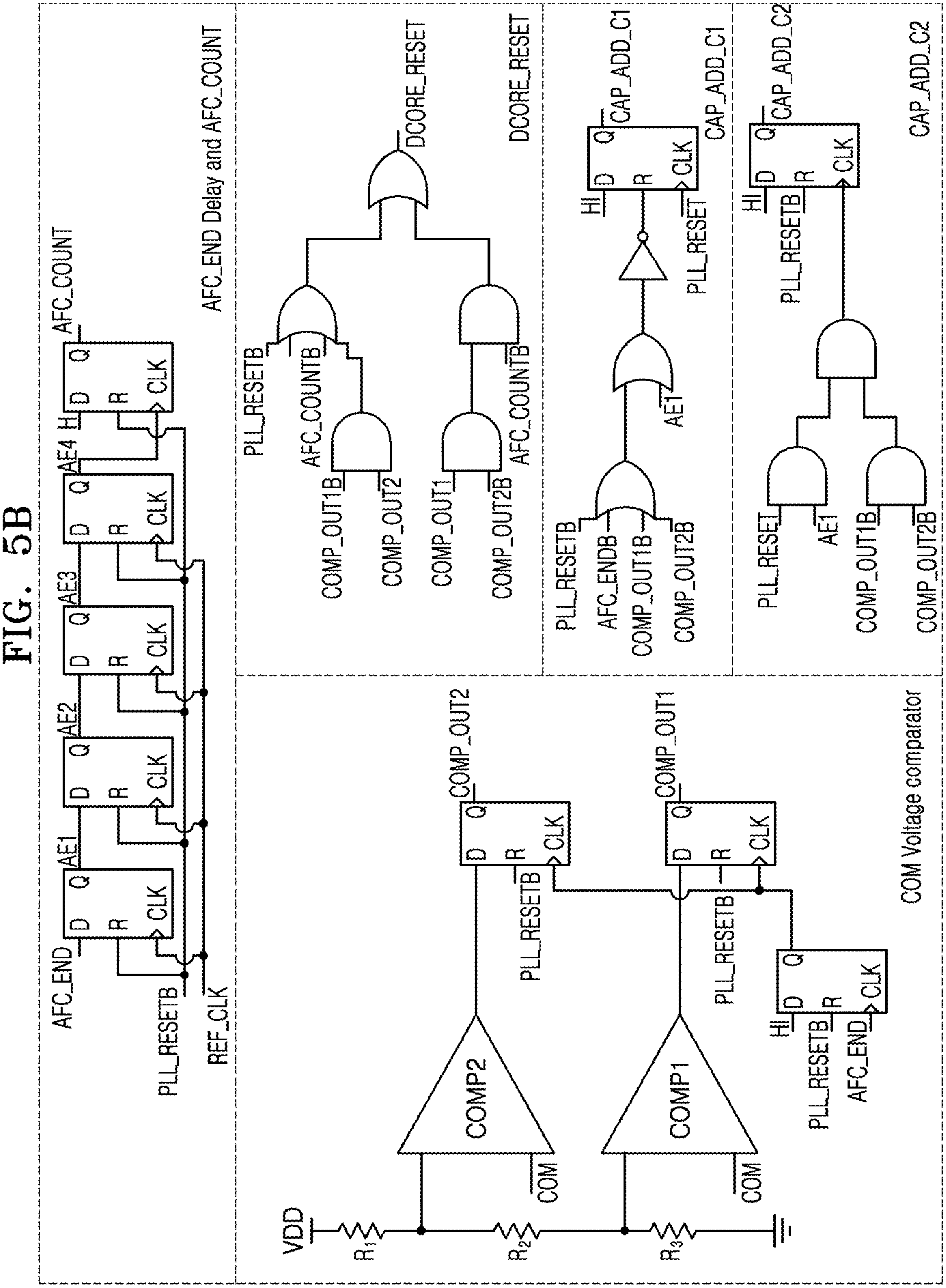

FIG. 5A and FIG. 5B illustrate a schematic diagram of the circuit of the current controlled oscillator, in accordance with at least one example embodiment of the inventive concepts. In at least one example embodiment, the FSM is driven by 2-bit Analog to Digital Converter (ADC) using two comparators to adaptively tune the ring oscillator by controlling tuning capacitors based on PVT corner, but is not limited thereto. The working of circuit is explained in detail in the flow chart of FIG. 3, but the example embodiments are not limited thereto.

Figure 6:
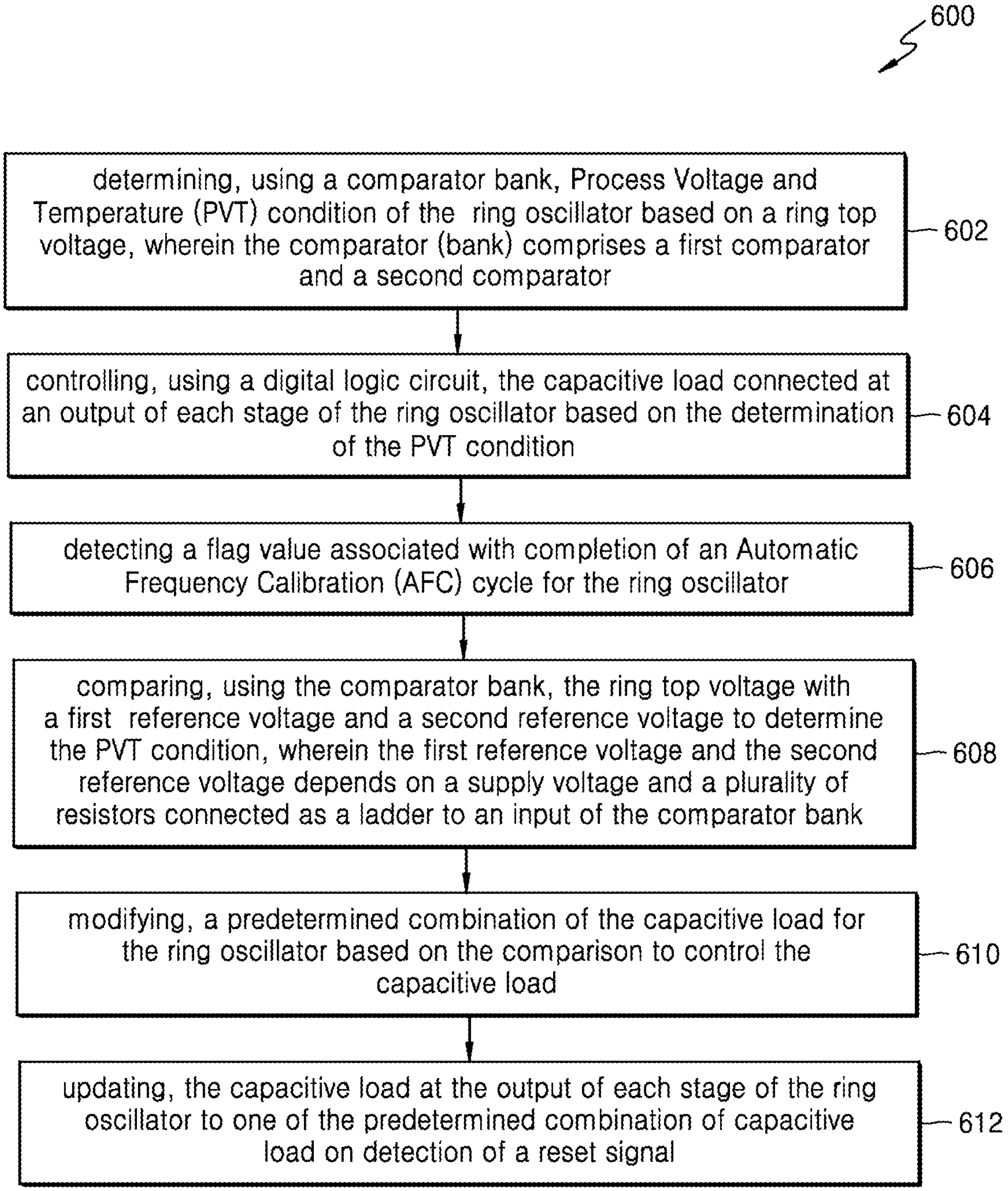
FIG. 6 illustrates a flow chart of a method for controlling a capacitive load for a ring oscillator, in accordance with at least one example embodiment of the inventive concepts.

FIG. 6 illustrates a flow chart of a method 600 for controlling a capacitive load for a ring oscillator, in accordance with at least one example embodiment of the inventive concepts.

At operation 602, the method 600 comprises determining, using a comparator bank, Process Voltage and Temperature (PVT) condition of the ring oscillator based on a ring top voltage. The comparator (bank) comprises a first comparator and a second comparator, but is not limited thereto.

At operation 604, the method 600 comprises controlling, using a digital logic circuit, the capacitive load connected at an output of each stage of the ring oscillator based on the determination of the PVT condition.

At operation 606, the method 600 comprises detecting a flag value associated with completion of an Automatic Frequency Calibration (AFC) cycle for the ring oscillator.

At operation 608, the method 600 comprises comparing, using the comparator bank, the ring top voltage with a first reference voltage and a second reference voltage to determine the PVT condition, but the example embodiments are not limited thereto. The first reference voltage and the second reference voltage depend on a supply voltage and a plurality of resistors connected as a ladder to an input of the comparator bank, but are not limited thereto.

At operation 610, the method 600 comprises modifying, a desired and/or predetermined combination of the capacitive load for the ring oscillator based on the comparison to control the capacitive load.

In at least one example embodiment, the first reference voltage is applied as an inverting input to the first comparator, and the second reference voltage is applied as an inverting input to the second comparator, but are not limited thereto. Further, the ring top voltage is applied as a non-inverting input at the first comparator and/or the second comparator, but is not limited thereto.

In at least one example embodiment, the capacitive load comprises a first set of capacitive load connected through a first switch and a second set of capacitive load connected through a second switch at the output of each stage of the ring oscillator, but the example embodiments are not limited thereto.

At operation 612, the method 600 comprises updating, the capacitive load at the output of each stage of the ring oscillator to one of the desired and/or predetermined combination of capacitive load on detection of a reset signal.

In at least one example embodiment, for a Low-Low output for the comparator bank, the method 600 comprises modifying, the desired and/or predetermined combination of the capacitive load by switching ON the second switch to add the second set of capacitive load. The modification is associated with an increase in the ring top voltage. The method 600 further comprises restarting the AFC cycle for the ring oscillator by the digital logic circuit.

In at least one example embodiment, for a High-High output for the comparator bank, the method 600 comprises modifying, the desired and/or predetermined combination of capacitive load by switching OFF the first switch to remove the first set of capacitive load. The modification is associated with a decrease in the ring top voltage. The method 600 further comprises restarting the AFC cycle for the ring oscillator by the digital logic circuit.

One or more example embodiments of the inventive concepts provide one or more of the following advantages:

- Some example embodiments provide improved and/or optimum combinations of tuning capacitors are selected to compensate the PVT corner by improving and/or ensuring both functionality (e.g., meeting frequency) and enhanced performance (e.g., improved and/or optimized jitter with improved SNR by decreasing and/or minimizing swing and/or improving and/or bettering PSIJ performance by reducing the maximum ring top voltage, etc.).
- Some example embodiments provide an improvement and/or a solution to the PSIJ sensitivity problem in slow corner due to high ring top voltage by adaptively decreasing the capacitor loading to bring down the ring top voltage. Further, SNR is improved and/or optimized in fast corner scenarios which suffer from low output swing by one or more example embodiments by adaptively increasing the capacitor loading to increase signal swing.
- Some example embodiments enable ultra-high speed ring oscillator (e.g., >9.5 GHz) to meet the wide frequency range (e.g., 1:2×) with reduced supply voltage (e.g., <0.9V), which is difficult to meet and/or cannot be met with traditional ring with fixed tuning caps.
- Some example embodiments reduce the ring top voltage in slow corners, which improves the power supply rejection ratio that results in more than 2× reduction in PSIJ at the output.
- Some example embodiments improve the ring top voltage (CMO) in fast corners, which improves the SNR at the output of ring oscillator that improves the jitter performance by ~56%.

In at least one example embodiment of the inventive concepts, detection of PVT conditions based on COM node voltage detection may be implemented in other CCOs. The dynamic cap switching as disclosed in at least one example embodiment of the inventive concepts is capable of being implemented by other CCOs which help to meet the wide band functionality at lower voltages with improved PN and/or PSIJ.

While specific language has been used to describe some example embodiments of the inventive concepts, any limitations arising on account of the same are not intended. As would be apparent to a person of ordinary skill in the art, various working modifications may be made to the example embodiments in order to implement the inventive concepts as taught herein.

The drawings and the forgoing description describe some example embodiments of the inventive concepts. Those of ordinary skill in the art will appreciate that one or more of the described elements may well be combined into a single functional element. Additionally, or alternatively, certain elements may be split into multiple functional elements. Elements from one example embodiment may be added to another example embodiment. For example, orders of processes described herein may be changed and are not limited to the manner described herein.

Moreover, the operations of any flow diagram and/or method need not be implemented in the order shown; nor do all of the operations necessarily need to be performed. Also, those acts that are not dependent on other operations may be performed in parallel with the other operations. The scope of the example embodiments are not limited to these specific examples. Numerous variations, whether explicitly given in the specification or not, such as differences in structure, dimension, and use of material, are possible. The scope of the example embodiments is at least as broad as given by the following claims.

Benefits, other advantages, and/or solutions to problems have been described above with regard to specific example embodiments. However, the benefits, advantages, and/or solutions to problems, and any component(s) that may cause any benefit, advantage, and/or solution to occur or become more pronounced are not to be construed as a critical, required, or essential feature or component of any or all the claims.

We claim:

1. A method for operating a ring oscillator, the method comprising:

determining, using a comparator bank, at least one Process Voltage and Temperature (PVT) condition of the ring oscillator based on a ring top voltage, the comparator bank including a first comparator and a second comparator, and the ring oscillator including a plurality of stages;

controlling, using processing circuitry, a capacitive load of the ring oscillator based on the determined at least one PVT condition, the capacitive load connected at an output of each stage of the plurality of stages of the ring oscillator; and updating the capacitive load at the output of each stage of the ring oscillator to a target combination of a plurality of combinations of capacitive load based on a detection of a reset signal.

2. The method as claimed in claim 1, further comprising:

detecting a flag value associated with completion of an Automatic Frequency Calibration (AFC) cycle for the ring oscillator;

determining the PVT condition, using the comparator bank, by comparing the ring top voltage with a first reference voltage and a second reference voltage, the first reference voltage and the second reference voltage based on a supply voltage and a plurality of resistors, the plurality of resistors connected as a ladder to an input of the comparator bank; and controlling the capacitive load for the ring oscillator based on the comparison of the ring top voltage with the first reference voltage and the second reference voltage.

3. The method as claimed in claim 2, wherein the first reference voltage is applied as an inverting input to the first comparator and the second reference voltage is applied as an inverting input to the second comparator; and the ring top voltage is applied as a non-inverting input at the first comparator and the second comparator.

4. The method as claimed in claim 1, wherein the capacitive load comprises:

a first set of capacitive loads connected through a first switch at the output of each stage of the ring oscillator; and a second set of capacitive loads connected through a second switch at the output of each stage of the ring oscillator.

5. The method as claimed in claim 2, wherein for a Low-Low output for the comparator bank, the controlling the capacitive load comprises:

modifying the capacitive load by switching ON a second switch to add a second set of capacitive loads, the modifying causing an increase in the ring top voltage; and restarting the AFC cycle for the ring oscillator by the processing circuitry.

6. The method as claimed in claim 2, wherein for a High-High output for the comparator bank, the controlling the capacitive load comprises:

modifying the capacitive load by switching OFF a first switch to remove a first set of capacitive loads, the modifying causing a decrease in the ring top voltage; and restarting the AFC cycle for the ring oscillator by the processing circuitry.

7. A system for controlling a ring oscillator, the system comprising:

a ring oscillator included in a Phase Locked Loop (PLL), the ring oscillator including a plurality of stages;

a comparator bank configured to determine at least one Process Voltage and Temperature (PVT) condition based on a ring top voltage in the ring oscillator, the comparator bank including a first comparator and a second comparator; and processing circuitry connected to the ring oscillator, the processing circuitry configured to:

control a capacitive load connected at an output of each stage of the plurality of stages of the ring oscillator based on an output of the comparator bank, and detect a flag value associated with completion of an automatic frequency calibration (AFC) cycle for the ring oscillator.

8. The system as claimed in claim 7, further comprising:

a first switch connected to a first set of capacitive loads; and the processing circuitry is further configured to control the first switch based on the output from the comparator bank.

9. The system as claimed in claim 7, further comprising:

a second switch connected to a second set of capacitive loads; and the processing circuitry is further configured to control the second switch based on the output from the comparator bank.

10. The system as claimed in claim 7, wherein the processing circuitry is further configured to:

restart an AFC cycle of the ring oscillator.

11. The system as claimed in claim 7, wherein the comparator bank is further configured to determine the PVT condition by comparing the ring top voltage with a first reference voltage and a second reference voltage, the first reference voltage and the second reference voltage based on a supply voltage and a plurality of resistors, the plurality of resistors connected as a ladder to an input of the comparator bank; and the processing circuitry is further configured to control the capacitive load for the ring oscillator by modifying a combination of the capacitive load based on the comparison of the ring top voltage with the first reference voltage and the second reference voltage.

12. The system as claimed in claim 11, wherein the first reference voltage is applied as an inverting input to the first comparator and the second reference voltage is applied as an inverting input to the second comparator; and the ring top voltage is applied as a non-inverting input at the first comparator and the second comparator.

13. The system as claimed in claim 7, wherein the capacitive load comprises:

a first set of capacitive loads connected through a first switch at the output of each stage of the ring oscillator; and a second set of capacitive loads connected through a second switch at the output of each stage of the ring oscillator.

14. The system as claimed in claim 7, wherein the processing circuitry is further configured to:

update the capacitive load at the output of each stage of the ring oscillator to one target combination of a plurality of combinations of capacitive load based on a detection of a reset signal.

15. The system as claimed in claim 7, wherein in response to a Low-Low output from the comparator bank, the processing circuitry is further configured to:

modify a capacitive load by switching ON a second switch to add a second set of capacitive loads, the modifying causing an increase in the ring top voltage; and restart the AFC cycle for the ring oscillator.

16. The system as claimed in claim 7, wherein in response to a High-High output from the comparator bank, the processing circuitry is further configured to:

modify a capacitive load by switching OFF a first switch to remove a first set of capacitive loads, the modifying causing a decrease in the ring top voltage; and restart the AFC cycle for the ring oscillator.

17. A device comprising:

a ring oscillator including a plurality of stages;

a comparator bank configured to determine at least one Process Voltage and Temperature (PVT) condition based on a ring top voltage in the ring oscillator, the comparator bank including a first comparator and a second comparator; and processing circuitry connected to the ring oscillator, the processing circuitry configured to:

control a capacitive load connected at an output of each stage of the plurality of stages of the ring oscillator based on an output of the comparator bank, and detect a flag value associated with completion of an automatic frequency calibration (AFC) cycle for the ring oscillator.

* * * * *